(12) United States Patent
Stringer

(10) Patent No.: US 9,813,800 B2
(45) Date of Patent: Nov. 7, 2017

(54) AUDIO SURVEILLANCE SYSTEM

(71) Applicant: Terry Stringer, East Hartford, CT (US)

(72) Inventor: Terry Stringer, East Hartford, CT (US)

(*) Notice: Subject to any disclaimer, the term of this patent is extended or adjusted under 35 U.S.C. 154(b) by 0 days.

(21) Appl. No.: 15/068,192

(22) Filed: Mar. 11, 2016

(65) Prior Publication Data

US 2017/0264988 A1 Sep. 14, 2017

(51) Int. Cl.
| | |
|---|---|
| *H04R 1/10* | (2006.01) |
| *H03G 3/30* | (2006.01) |
| *H04R 1/08* | (2006.01) |
| *H04R 29/00* | (2006.01) |

(52) U.S. Cl.
CPC ......... *H04R 1/1041* (2013.01); *H03G 3/3005* (2013.01); *H04R 1/08* (2013.01); *H04R 1/105* (2013.01); *H04R 1/1008* (2013.01); *H04R 1/1033* (2013.01); *H04R 29/001* (2013.01)

(58) Field of Classification Search
CPC ............ H03G 3/24; H03G 3/32; H03G 3/001; H03G 3/3005; H03G 3/3089; H03G 7/007; H04R 1/1016; H04R 1/1041; H04R 5/033; H04R 5/04; H04R 2420/05; H04R 2420/07
USPC ... 381/57, 74, 104, 105, 107, 108, 109, 119, 381/370, 372, 384; 455/575.2
See application file for complete search history.

(56) References Cited

U.S. PATENT DOCUMENTS

| | | | | |
|---|---|---|---|---|
| 5,450,494 | A * | 9/1995 | Okubo | H03G 3/32 348/E5.122 |
| 6,397,087 | B1 * | 5/2002 | Kim | H04B 1/3877 381/110 |
| D463,790 | S | 10/2002 | Beraut et al. | |
| 6,868,162 | B1 * | 3/2005 | Jubien | H03G 5/22 381/107 |
| 7,395,090 | B2 * | 7/2008 | Alden | H04B 1/3805 381/74 |
| 7,903,825 | B1 * | 3/2011 | Melanson | H03G 3/32 381/103 |
| 7,986,802 | B2 * | 7/2011 | Ziller | H04M 1/6025 379/392.01 |
| 8,023,663 | B2 | 9/2011 | Goldberg | |
| 8,073,153 | B2 | 12/2011 | Loeppert | |
| 8,270,629 | B2 * | 9/2012 | Bothra | H04M 1/6058 381/309 |
| 8,340,323 | B2 * | 12/2012 | Asada | H04R 1/1041 381/103 |
| 8,345,885 | B2 * | 1/2013 | Takada | H04M 9/082 379/392.01 |

(Continued)

FOREIGN PATENT DOCUMENTS

NO WO2014195690 12/2014

*Primary Examiner* — Xu Mei

(57) ABSTRACT

A audio surveillance system includes a pair of headphones. An audio unit is coupled to the pair of headphones and the audio receives a first signal and a second signal. The audio unit records ambient sounds with respect to the headphones thereby facilitating the audio unit to receive the second signal. A control unit is selectively coupled to the headphones and the control unit may be manipulated. The control unit is in electrical communication with the audio unit when the control unit is coupled to the headphones. The control unit adjusts a volume of the second signal with respect to the first signal. Thus, the control unit facilitates a user to monitor the ambient sounds while the user listens to music.

6 Claims, 5 Drawing Sheets

(56) References Cited

U.S. PATENT DOCUMENTS

| | | |
|---|---|---|
| 8,379,872 B2 | 2/2013 | Parkins |
| 9,105,187 B2 * | 8/2015 | Aliakseyeu .......... G08G 1/0965 |
| 9,219,371 B2 * | 12/2015 | Lee ....................... H02J 7/0052 |
| 2009/0232325 A1 * | 9/2009 | Lundquist ................ H03G 3/32 |
| | | 381/74 |
| 2010/0215198 A1 | 8/2010 | Ngia et al. |
| 2011/0206217 A1 | 8/2011 | Weis |

* cited by examiner

AUDIO SURVEILLANCE SYSTEM

BACKGROUND OF THE DISCLOSURE

Field of the Disclosure

The disclosure relates to surveillance devices and more particularly pertains to a new surveillance device for monitoring ambient sounds while listening to headphones.

SUMMARY OF THE DISCLOSURE

An embodiment of the disclosure meets the needs presented above by generally comprising a pair of headphones. An audio unit is coupled to the pair of headphones and the audio receives a first signal and a second signal. The audio unit records ambient sounds with respect to the headphones thereby facilitating the audio unit to receive the second signal. A control unit is selectively coupled to the headphones and the control unit may be manipulated. The control unit is in electrical communication with the audio unit when the control unit is coupled to the headphones. The control unit adjusts a volume of the second signal with respect to the first signal. Thus, the control unit facilitates a user to monitor the ambient sounds while the user listens to music.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
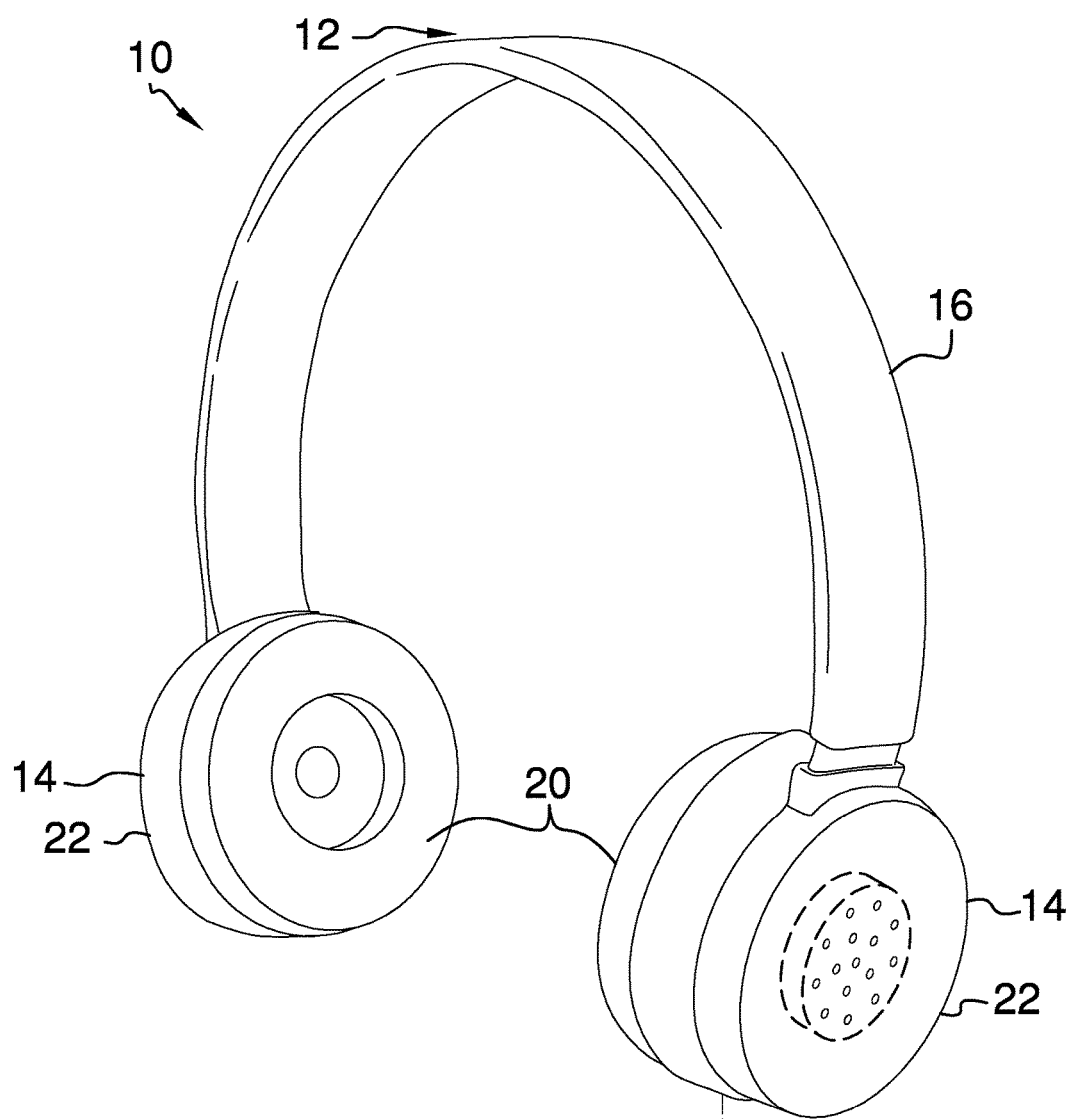
FIG. 1 is a perspective view of a audio surveillance system according to an embodiment of the disclosure.
Figure 2:
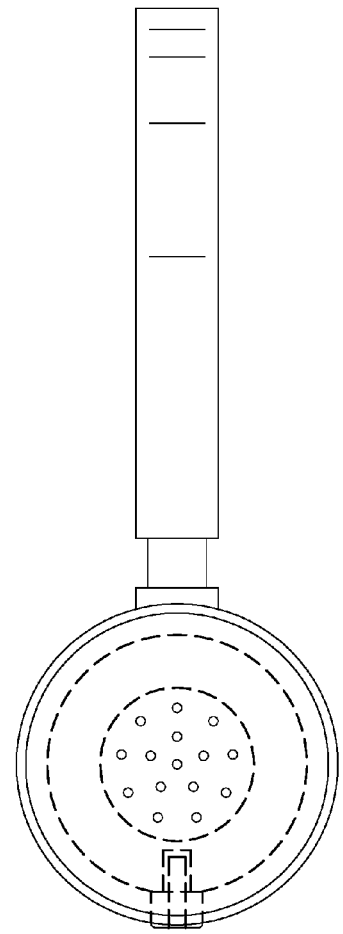
FIG. 2 is a right side phantom view of an embodiment of the disclosure.
Figure 3:
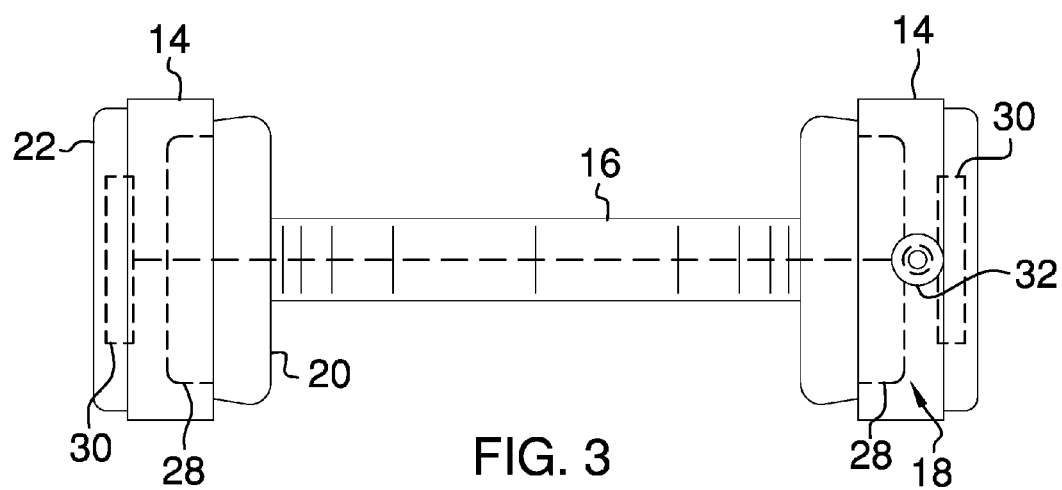
FIG. 3 is a bottom phantom view of an embodiment of the disclosure.
Figure 4:
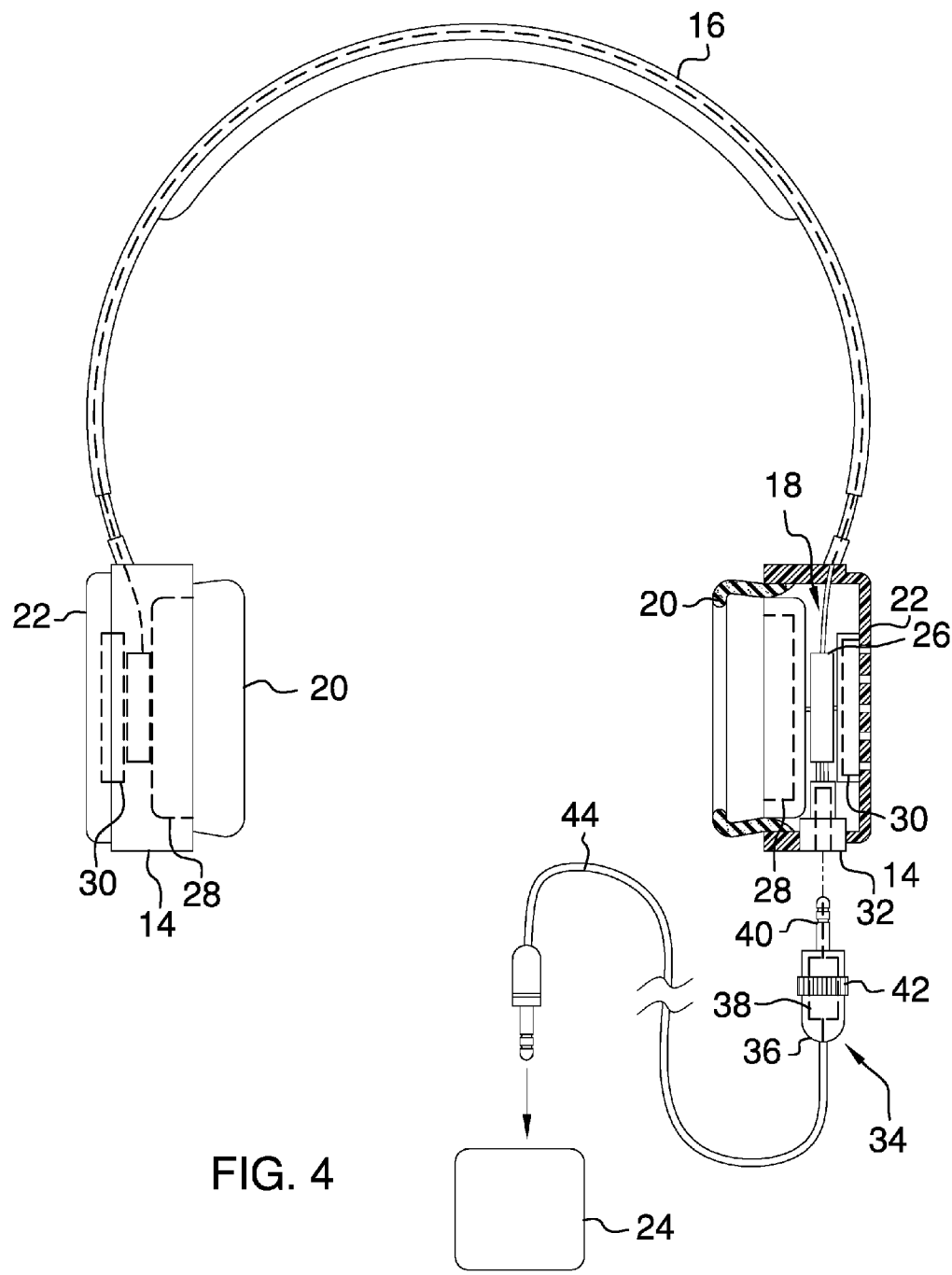
FIG. 4 is a front cut-away view of an embodiment of the disclosure.

With reference now to the drawings, and in particular to FIGS. 1 through 6 thereof, a new surveillance device embodying the principles and concepts of an embodiment of the disclosure and generally designated by the reference numeral 10 will be described.

As best illustrated in FIGS. 1 through 6, the audio surveillance system 10 generally comprises a pair of headphones 12 that may be worn. The headphones 12 include a pair of muffs 14 and a curved member 16 extending between the pair of muffs 14. An audio unit 18 is coupled to the headphones 12. The audio unit 18 receives a first signal and a second signal. Each of the muffs 14 has a first side 20 and a second side 22. The first side 20 corresponding to each of the muffs 14 is directed toward each other.

The audio unit 18 may be electrically coupled to a signal source 24. Thus, the audio unit 18 may receive the first signal from the signal source 24. The signal source 24 may comprise a smart phone or other electronic storage device. The audio unit 18 records ambient sounds with respect to the headphones 12. Thus, the audio unit 18 receives the second signal.

The audio unit 18 comprises a processor 26 that is positioned within the headphones 12. The processor 26 may comprise an electronic processor or the like. A pair of speakers 28 is provided. Each of the speakers 28 is positioned within an associated one of the muffs 14. Thus, each of the speakers 28 may emit audible sound. Each of the speakers 28 is electrically coupled to the processor 26. Each of the speakers 28 is positioned on the first side 20 of the associated muff 14.

A pair of microphones 30 is provided. Each of the microphones 30 is coupled to an associated one of the muffs 14. Thus, each of the microphones 30 may detect the ambient sounds with respect to the headphones 12. Each of the microphones 30 is electrically coupled to the processor 26. Each of the microphones 30 is positioned on the second side 22 of the associated muff 14.

A port 32 is provided. The port 32 is coupled to an associated one of the muffs 14. Moreover, the port 32 is electrically coupled to the processor 26. The port 32 may comprise a female ¼ inch audio jack or the like.

A control unit 34 is provided. The control unit 34 is selectively coupled to the headphones 12 and the control unit 34 may be manipulated. The control unit 34 is in electrical communication with the audio unit 18 when the control unit 34 is coupled to the headphones 12. The control unit 34 adjusts a volume of the second signal with respect to the first signal. Thus, the control unit 34 facilitates a user to monitor the ambient sounds while the user listens to music.

The control unit 34 comprises a plug 36 that has an outer wall 38 and a conductor 40. The conductor 40 is selectively electrically coupled to the port 32. A ring 42 is movably coupled to the outer wall 38 and the ring 42 may be manipulated. The ring 42 may be rotated around the outer wall 38.

The ring 42 is electrically coupled to the conductor 40 such that the ring 42 is in communication with the processor 26 when the conductor 40 is electrically coupled to the port 32. The ring 42 adjusts a strength of the second signal between a minimum amount and a maximum amount. Thus, the ring 42 adjusts a volume of the ambient sounds with respect to the music.

A cord 44 is provided and the cord 44 extends outwardly from the plug 36. Thus, the cord 44 may be electrically coupled to the signal source 24. The cord 44 is electrically coupled to the conductor 40. Thus, the cord 44 delivers the first signal to the processor 26 when the conductor 40 is electrically coupled to the port 32. The cord 44 may comprise a ¼ inch audio cord or the like.

Figure 5:
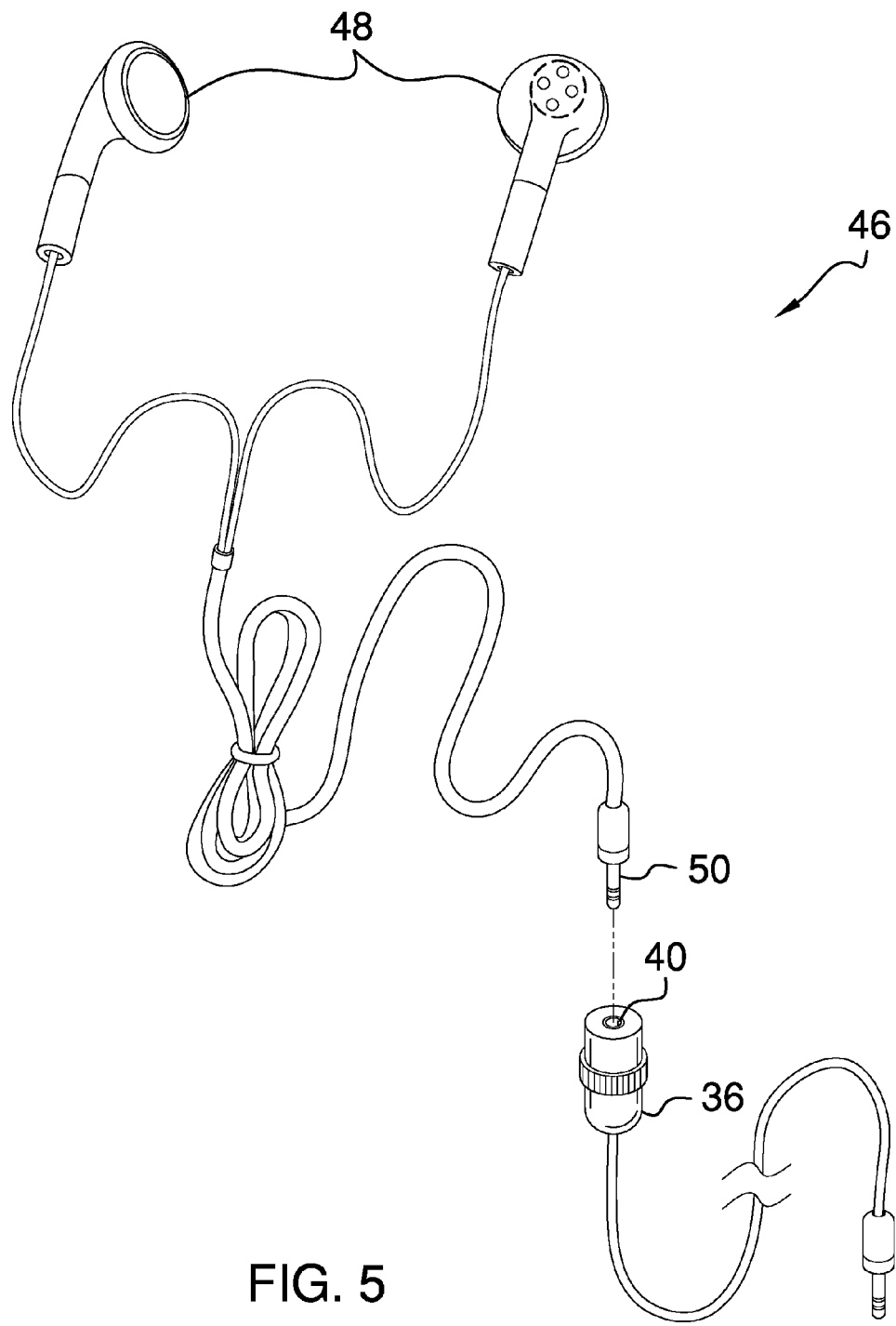
FIG. 5 is a perspective view of an alternative embodiment of the disclosure.
Figure 6:
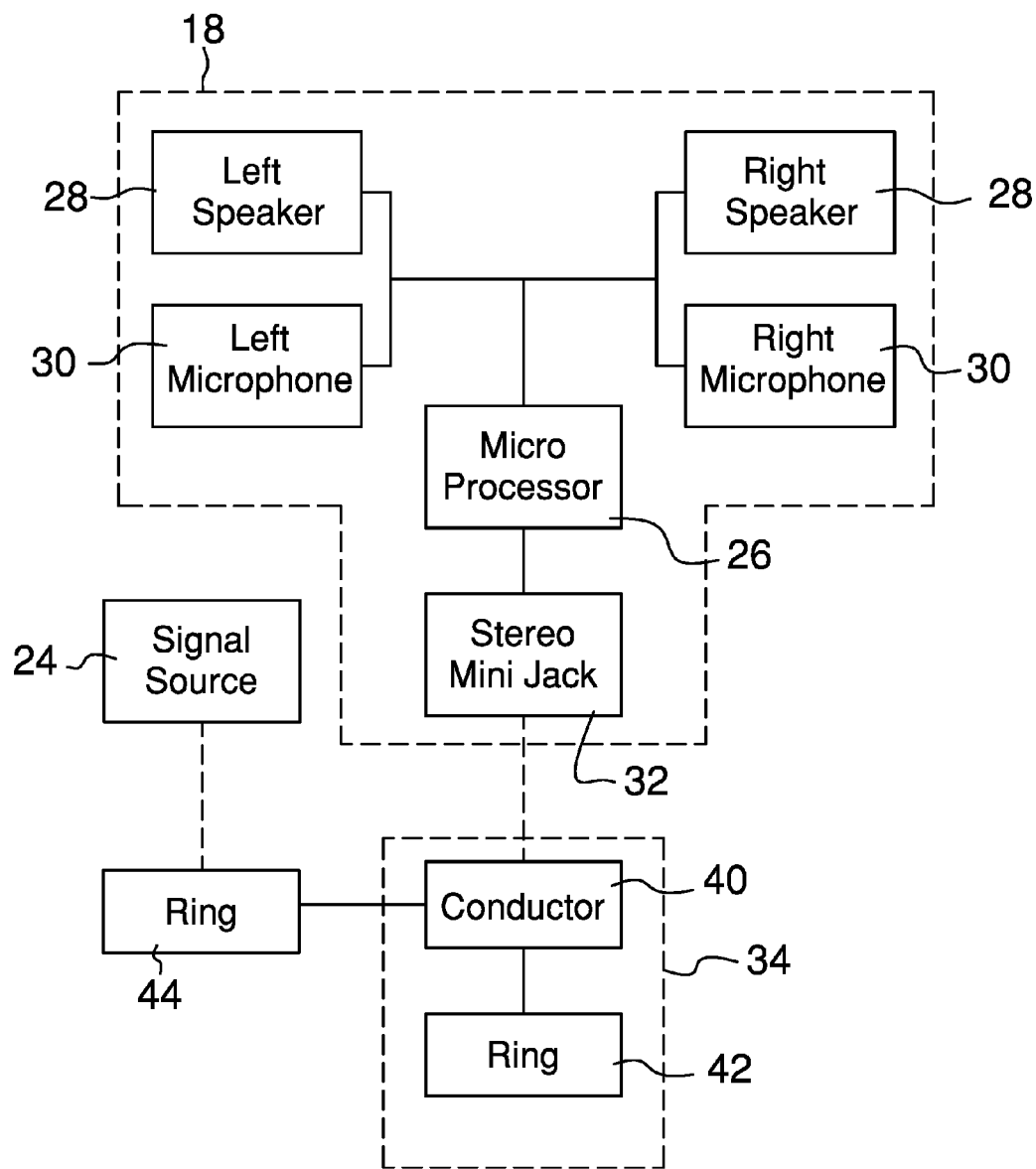
FIG. 6 is a schematic view of an embodiment of the disclosure.

In an alternative embodiment 46 as shown in FIG. 5, the headphones 12 may comprise a pair of ear buds 48. Additionally, the ear buds 48 may include a male audio plug 50.

The conductor 40 may be recessed into the plug 36. Thus, the conductor 40 may insertably receive the male audio plug 50 on the ear buds 48.

In use, the headphones 12 are worn. The conductor 40 is electrically coupled to the port 32 and the cord 44 is electrically coupled to the signal source 24. The speakers 28 emit the first signal received from the signal source 24. The ring 42 is manipulated to adjust a volume of the second signal with respect to the first signal. Thus, the user may monitor ambient sounds while user listens to the first signal. The headphones 12 are worn in an area involving public announcements such as an airport or the like. Thus, the user hears the public announcement while the user listens to the headphones 12.

With respect to the above description then, it is to be realized that the optimum dimensional relationships for the parts of an embodiment enabled by the disclosure, to include variations in size, materials, shape, form, function and manner of operation, system and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. An audio surveillance system being configured to mix ambient sounds with recorded sounds, said system comprising:
    a pair of headphones, said pair of headphones being configured to be worn, said pair of headphones including a pair of muffs and a curved member extending between said pair of muffs;
    an audio unit being coupled to said pair of headphones, said audio receiving a first signal and a second signal, said audio unit being configured to be electrically coupled to an signal source thereby facilitating said audio unit to receive said first signal from the signal source, said audio unit being configured to record ambient sounds with respect to said headphones thereby facilitating said audio unit to receive said second signal, said audio unit including a port and a processor; and
    a control unit being selectively coupled to said headphones wherein said control unit is configured to be manipulated, said control unit being in electrical communication with said audio unit when said control unit is coupled to said headphones, said control unit adjusting a volume of said second signal with respect to said first signal wherein said control unit is configured to facilitate a user to monitor the ambient sounds while the user listens to music, said control unit comprising
        a plug having an outer wall and a conductor, said conductor being selectively electrically coupled to said port, and
        a ring being movably coupled to said outer wall wherein said ring is configured to be manipulated, said ring being electrically coupled to said conductor such that said ring is in communication with said processor when said conductor is electrically coupled to said port, said ring adjusting a strength of said second signal between a minimum amount and a maximum amount wherein said ring is configured to adjust a volume of the ambient sounds with respect to the music.

2. The system according to claim 1, wherein said audio unit comprises:
    said processor being positioned within said headphones; and
    a pair of speakers, each of said speakers being positioned within an associated one of said muffs wherein each of said speakers is configured to emit audible sound, each of said speakers being electrically coupled to said processor.

3. The system according to claim 2, further comprising a pair of microphones, each of said microphones being coupled to an associated one of said muffs wherein each of said microphones is configured to detect the ambient sounds, each of said microphones being electrically coupled to said processor.

4. The system according to claim 3, further comprising said port being coupled to an associated one of said muffs, said port being electrically coupled to said processor.

5. The system according to claim 1, further comprising a cord extending outwardly from said plug wherein said cord is configured to be electrically coupled to a signal source, said cord being electrically coupled to said conductor such that said cord delivers said first signal to said processor when said conductor is electrically coupled to said port.

6. An audio surveillance system being configured to mix ambient sounds with recorded sounds, said system comprising:
    a pair of headphones, said pair of headphones being configured to be worn, said pair of headphones including a pair of muffs and a curved member extending between said pair of muffs;
    an audio unit being coupled to said pair of headphones, said audio receiving a first signal and a second signal, said audio unit being configured to be electrically coupled to an signal source thereby facilitating said audio unit to receive said first signal from the signal source, said audio unit being configured to record ambient sounds with respect to said headphones thereby facilitating said audio unit to receive said second signal, said audio unit comprising:
        a processor being positioned within said headphones,
        a pair of speakers, each of said speakers being positioned within an associated one of said muffs wherein each of said speakers is configured to emit audible sound, each of said speakers being electrically coupled to said processor,
        a pair of microphones, each of said microphones being coupled to an associated one of said muffs wherein each of said microphones is configured to detect the ambient sounds, each of said microphones being electrically coupled to said processor, and
        a port being coupled to an associated one of said muffs, said port being electrically coupled to said processor; and
    a control unit being selectively coupled to said headphones wherein said control unit is configured to be manipulated, said control unit being in electrical communication with said audio unit when said control unit is coupled to said headphones, said control unit adjusting a volume of said second signal with respect to said first signal wherein said control unit is configured to facilitate a user to monitor the ambient sounds while the user listens to music, said control unit comprising:
- a plug having an outer wall and a conductor, said conductor being selectively electrically coupled to said port,
- a ring being movably coupled to said outer wall wherein said ring is configured to be manipulated, said ring being electrically coupled to said conductor such that said ring is in communication with said processor when said conductor is electrically coupled to said port, said ring adjusting a strength of said second signal between a minimum amount and a maximum amount wherein said ring is configured to adjust a volume of the ambient sounds with respect to the music, and
- a cord extending outwardly from said plug wherein said cord is configured to be electrically coupled to a signal source, said cord being electrically coupled to said conductor such that said cord delivers said first signal to said processor when said conductor is electrically coupled to said port.

* * * * *